United States Patent
Tsunekawa et al.

(10) Patent No.: US 8,932,438 B2
(45) Date of Patent: Jan. 13, 2015

(54) METHOD OF MANUFACTURING MAGNETORESISTIVE ELEMENT, SPUTTER DEPOSITION CHAMBER, APPARATUS FOR MANUFACTURING MAGNETORESISTIVE ELEMENT HAVING SPUTTER DEPOSITION CHAMBER, PROGRAM AND STORAGE MEDIUM

(75) Inventors: Koji Tsunekawa, Tokyo (JP); Hiroyuki Hosoya, Tama (JP); Yoshinori Nagamine, Tama (JP); Shinji Furukawa, Cupertino, CA (US); Naoki Watanabe, Kawasaki (JP)

(73) Assignee: Canon Anelva Corporation, Kanagawa-Ken (JP)

( * ) Notice: Subject to any disclaimer, the term of this patent is extended or adjusted under 35 U.S.C. 154(b) by 1059 days.

(21) Appl. No.: 12/972,823

(22) Filed: Dec. 20, 2010

(65) Prior Publication Data

US 2011/0139606 A1 Jun. 16, 2011

Related U.S. Application Data

(63) Continuation of application No. PCT/JP2009/051213, filed on Jan. 26, 2009.

(30) Foreign Application Priority Data

Jun. 20, 2008 (JP) .................... 2008-162385

(51) Int. Cl.
*C23C 14/34* (2006.01)
*G11B 5/39* (2006.01)
(Continued)

(52) U.S. Cl.
CPC ............ *G11B 5/3909* (2013.01); *B82Y 10/00* (2013.01); *B82Y 25/00* (2013.01); *B82Y 40/00* (2013.01); *C23C 14/14* (2013.01); *C23C 14/225* (2013.01); *C23C 14/3464* (2013.01); *G01R 33/093* (2013.01); *G01R 33/098* (2013.01); *G11B 5/3903* (2013.01); *H01F 10/3254* (2013.01); *H01F 10/3272* (2013.01);
(Continued)

(58) Field of Classification Search
USPC ........................................ 204/192.2
See application file for complete search history.

(56) References Cited

U.S. PATENT DOCUMENTS

| | | |
|---|---|---|
| 5,447,781 A | 9/1995 | Kano et al. |
| 6,086,727 A | 7/2000 | Pinarbasi |

(Continued)

FOREIGN PATENT DOCUMENTS

| | | |
|---|---|---|
| JP | 6-220609 A | 8/1994 |
| JP | 11-158616 A | 6/1999 |

(Continued)

OTHER PUBLICATIONS

Machine Translation of JP 2002-043159 dated Feb. 2002.*
(Continued)

*Primary Examiner* — Rodney McDonald
(74) *Attorney, Agent, or Firm* — Buchanan Ingersoll & Rooney PC

(57) ABSTRACT

The magnetic anisotropy of a magnetic layer in a spin valve tunnel magnetoresistive element or giant magnetoresistive element is enhanced. Deposition of the magnetic layer is performed by making sputtering particles obliquely incident on a substrate from a certain incident direction at a certain incident angle.

6 Claims, 12 Drawing Sheets

(51) Int. Cl.
    *B82Y 10/00*     (2011.01)
    *B82Y 25/00*     (2011.01)
    *B82Y 40/00*     (2011.01)
    *C23C 14/14*     (2006.01)
    *C23C 14/22*     (2006.01)
    *G01R 33/09*     (2006.01)
    *H01F 10/32*     (2006.01)
    *H01F 41/18*     (2006.01)
    *H01F 41/30*     (2006.01)
    *H01L 43/12*     (2006.01)
    *G11B 5/31*     (2006.01)

(52) U.S. Cl.
    CPC ............. *H01F 41/18* (2013.01); *H01F 41/302* (2013.01); *H01L 43/12* (2013.01); *G11B 5/3163* (2013.01); *G11B 2005/3996* (2013.01); *H01F 10/325* (2013.01)
    USPC ..................................................... 204/192.2

(56) References Cited

U.S. PATENT DOCUMENTS

| | | | |
|---|---|---|---|
| 6,238,531 | B1 | 5/2001 | Pinarbasi |
| 6,818,961 | B1 | 11/2004 | Rizzo et al. |
| 7,229,532 | B2 | 6/2007 | Ando et al. |
| 7,876,536 | B2 | 1/2011 | Hoshino et al. |
| 2002/0017910 | A1 | 2/2002 | Sakai |
| 2002/0064595 | A1 | 5/2002 | Nomura et al. |
| 2005/0083612 | A1 | 4/2005 | Djayaprawira et al. |

FOREIGN PATENT DOCUMENTS

| | | |
|---|---|---|
| JP | 2000-073165 A | 3/2000 |
| JP | 2002-043159 A | 2/2002 |
| JP | 2002-053956 A | 2/2002 |
| JP | 2002-167661 A | 6/2002 |
| JP | 2004-219532 A | 8/2004 |
| JP | 2004-269988 A | 9/2004 |
| JP | 2005-123412 A | 5/2005 |
| JP | 2007-525005 A | 8/2007 |
| JP | 2007-281087 A | 10/2007 |
| JP | 2007-321238 A | 12/2007 |
| JP | 2008-081782 A | 4/2008 |

OTHER PUBLICATIONS

Machine Translation of JP 2007-281087 dated Oct. 2007.*
Office Action (Grounds for Rejection) dated Feb. 25, 2013, issued in corresponding Japanese Patent Application No. 2010-517776, and an English Translation thereof. (8 pgs).
International Search Report (PCT/ISA/210) issued on Apr. 28, 2009, by Japanese Patent Office as the International Searching Authority for International Application No. PCT/JP2009/051213.
Written Opinion (PCT/ISA/237) issued on Apr. 28, 2009, by Japanese Patent Office as the International Searching Authority for International Application No. PCT/JP2009/051213.
International Preliminary Examination Report (PCT/IPEA/409) issued on Oct. 4, 2010, by Japanese Patent Office as the International Searching Authority for International Application No. PCT/JP2009/051213.
Hoshiya et al., "CPP-GMR Films With Oblique Deposition", IEEE Trans. Magn., Oct. 2006, pp. 3023-3024, vol. 42, No. 10.
Co-pending U.S. Appl. No. 12/872,497 by Y. Choi et al., filed Aug. 31, 2010.
Yu et al., "Development of FeCo-Based Thin Films for Gigahertz Applications", IEEE Transactions on Magnetics, Oct. 2005, pp. 3259-3261, vol. 41, No. 10.
Cohen, "Anisotropy in Permalloy Films Evaporated at Grazing Incidence", Journal of Applied Physics, Mar. 1961, pp. 87-88, vol. 32, No. 3.
Kinbara et al., "Thin Films", Applied Physics, Dec. 20, 1989, pp. 274-275, vol. 3, described on p. 2 of the present application.
Office Action (Grounds for Rejection) issued on May 2, 2014, by the Japan Patent Office in corresponding Japanese Patent Application No. 2013-185674, and a partial English Translation of the Office Action. (9 pages).

* cited by examiner

FIG. 2
| Ru (7nm) | |
|---|---|
| Ta (10nm) | 18 |
| $Co_{60}Fe_{20}B_{20}$ (3nm) | 17 |
| MgO (1.2nm) | 16 |
| $Co_{60}Fe_{20}B_{20}$ (3nm) | 15 |
| Ru (0.9nm) | 14 — 19 |
| $Co_{70}Fe_{30}$ (2.5nm) | 13 |
| PtMn (15nm) | 12 |
| Ta (10nm) | 11 |
| SUBSTRATE | 8 |
FIG. 3
FIG. 4
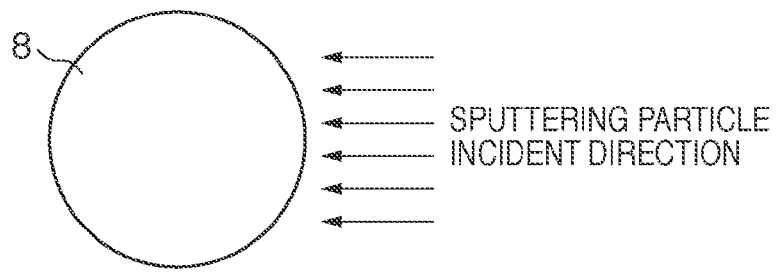

FIG. 5
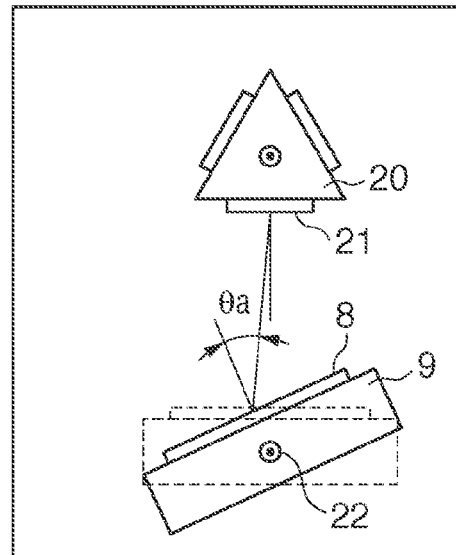
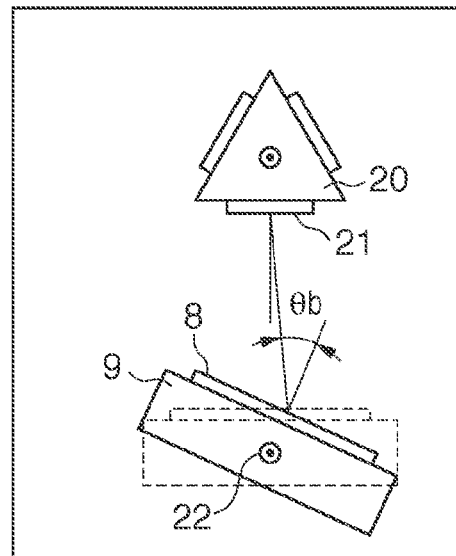

METHOD OF MANUFACTURING MAGNETORESISTIVE ELEMENT, SPUTTER DEPOSITION CHAMBER, APPARATUS FOR MANUFACTURING MAGNETORESISTIVE ELEMENT HAVING SPUTTER DEPOSITION CHAMBER, PROGRAM AND STORAGE MEDIUM

The present application is a by-pass continuation of PCT/JP2009/051213, filed on Jan. 26, 2009, and which claims the priority of JP 2008-162385, filed on Jun. 20, 2008. The entire contents of PCT/JP2009/051213 and JP 2008-162385 are incorporated herein by reference.

TECHNICAL FIELD

The present invention relates to a method of manufacturing a magnetoresistive element, a sputter deposition chamber, an apparatus for manufacturing a magnetoresistive element having a sputter deposition chamber, a program, and a storage medium.

BACKGROUND ART

The multilayered film of a spin valve tunnel magnetoresistive element or giant magnetoresistive element is formed by a sputtering method, as described in PTL1. In deposition of a magnetic layer, uni-axial magnetic anisotropy must be imparted to align the magnetization direction of the magnetic layer.

As a method of imparting uni-axial magnetic anisotropy to the magnetic layer, for example, the magnetic layer generally undergoes sputter deposition while being applied with a magnetic field which is parallel to a substrate surface and is aligned in one direction, as described in PTL2. The magnetic anisotropy imparted by applying an external magnetic field is called induced magnetic anisotropy.

On the other hand, as a method of imparting magnetic anisotropy to the magnetic layer in addition to the above method, there is well known a method of depositing a magnetic film on a substrate so that deposition particles are incident from a certain oblique direction, that is, a so-called oblique incidence deposition method, as explained in NPL1 and NPL2. From NPL1 and NPL2, it is found that an anisotropic magnetic field Hk increases as the incident angle exceeds 30°. The magnetic anisotropy imparted by the oblique incidence deposition method is regarded as shape magnetic anisotropy since the shape of a crystal grain obliquely grown is considered as the origin of the magnetic anisotropy, as described in NPL3.

The method of imparting shape anisotropy by the oblique incidence deposition has been often used for a magnetic single-layered film as a thick film with a thickness of several-micron order used for a thin-film inductor but has not been used for manufacturing a spin valve magnetoresistive element formed by a multilayered film as a thin film with a thickness of several-nanometer order.

CITATION LIST

Patent Literature

PTL1: Japanese Patent Laid-Open No. 2002-167661
PTL2: Japanese Patent Laid-Open No. 2002-53956

Non Patent Literature

NPL1: M. S. Cohen, "Journal Of Applied Physics", 32, 87S (1961)

NPL2: E. Yu et al., "IEEE Transactions On Magnetics", 41, 3259 (2005)

NPL3: Akira Kinbara and Hideo Fujiwara, "Thin Film, Applied Physics Series, vol. 3", p. 275, 9 th ed. published by Shokabo on Dec. 20, 1989

SUMMARY OF INVENTION

Technical Problem

Along with an increase in storage capacity of a magnetic disk or magnetic random access memory, the size of a magnetic reproducing head or memory element to be used in the magnetic disk or magnetic random access memory has to be smaller. That is, the processed size of a magnetoresistive element needs to be smaller. As the element size becomes smaller, the volume V of a magnetic layer also becomes small, thereby decreasing a KuV/kT value known as a thermal stability index. Note that Ku represents a magnetic anisotropy energy per unit volume, and Ku=Ms·Hk/2. Ms indicates the saturation magnetization of a magnetic material; Hk, an anisotropic magnetic field; k, a Boltzmann constant; and T, an absolute temperature. A decrease in KuV/kT value means that the magnetization state of the magnetic layer becomes unstable by heat. In order not to decrease the KuV/kT value even when V becomes small, it is important to increase Ku.

For the magnetization free layer of a spin valve magnetoresistive element, a challenge is to increase Hk of the magnetic layer to make Ku large, since in the equation Ku=Ms·Hk/2, Ms is a constant determined depending on a magnetic material to be used. As explained in NPL3, since a unidirectional magnetic anisotropy energy Jk generated on an interface between an antiferromagnetic layer and the first magnetization fixed layer is proportional to Ku, it is required to increase Jk to improve the thermal stability of the first magnetization fixed layer.

Solution to Problem

The present invention has as its object to provide a technique capable of enhancing the magnetic anisotropy of a magnetic layer in a magnetoresistive element, in particular a spin valve tunnel magnetoresistive element or giant magnetoresistive element.

There is provided a method of manufacturing a magnetoresistive element according to the present invention to achieve the above-described object, in which a buffer layer, an antiferromagnetic layer, a first magnetization fixed layer, an exchange-coupling nonmagnetic layer, a second magnetization fixed layer, a tunnel barrier layer or nonmagnetic conductive layer, a magnetization free layer, and a protective layer are stacked on a substrate by sputter deposition, the method comprising:

a first step of performing sputter deposition of at least one of the first magnetization fixed layer, the second magnetization fixed layer, and the magnetization free layer by making sputtering particles obliquely incident on the substrate from a certain incident direction at a certain incident angle and using a stationary non-rotated substrate; and a second step of performing sputter deposition of at least one of the buffer layer, the antiferromagnetic layer, the exchange-coupling nonmagnetic layer, the tunnel barrier layer or nonmagnetic conductive layer, the magnetization free layer, and the protective layer by making sputtering particles obliquely incident on the substrate at a certain incident angle and using a rotated substrate.

There is provided a method of manufacturing a magnetoresistive element according to the present invention, in which a buffer layer, an antiferromagnetic layer, a first magnetization fixed layer, an exchange-coupling nonmagnetic layer, a second magnetization fixed layer, a tunnel barrier layer or nonmagnetic conductive layer, a magnetization free layer, and a protective layer are stacked on a substrate by sputter deposition, the method comprising:

a first step of performing sputter deposition of at least one of the first magnetization fixed layer, the second magnetization fixed layer, and the magnetization free layer by making sputtering particles obliquely incident on the substrate from a certain incident direction at a certain incident angle and using a stationary non-rotated substrate; and a second step of performing sputter deposition of at least one of the buffer layer, the antiferromagnetic layer, the exchange-coupling nonmagnetic layer, the tunnel barrier layer or nonmagnetic conductive layer, the magnetization free layer, and the protective layer by making sputtering particles perpendicularly incident on the substrate.

There is provided a method of manufacturing a magnetoresistive element according to the present invention, in which a buffer layer, an antiferromagnetic layer, a first magnetization fixed layer, an exchange-coupling nonmagnetic layer, a second magnetization fixed layer, a tunnel barrier layer or nonmagnetic conductive layer, a magnetization free layer, and a protective layer are stacked on a substrate by sputter deposition, the method comprising:

a first step of performing sputter deposition of at least one of the first magnetization fixed layer, the second magnetization fixed layer, and the magnetization free layer by making sputtering particles obliquely incident on the substrate from a certain incident direction at a certain incident angle; and a second step of performing, after the first step, sputter deposition by making sputtering particles obliquely incident on the substrate from a certain incident direction shifted from the incident direction by 180° at a certain incident angle identical to the incident angle.

There is provided a sputter deposition chamber according to the present invention, comprising:

a substrate support holder for supporting a substrate on which a thin film is deposited;

a sputtering cathode which is electrically insulated from the substrate, and is arranged to be opposite to the substrate; and a sputtering target which is supported by the sputtering cathode, and is made of a material identical to the thin film or a source material of the thin film, wherein an angle between a line segment connecting a center of the sputtering target to a center of the substrate and a normal to a surface of the substrate falls within a range from 10° (inclusive) to 80° (inclusive).

There is provided a sputter deposition chamber according to the present invention, comprising:

a substrate support holder for supporting a substrate on which a thin film is deposited;

a sputtering cathode which is electrically insulated from the substrate, and is arranged to be opposite to the substrate; and a sputtering target which is supported by the sputtering cathode, and is made of a material identical to the thin film or a source material of the thin film, wherein the substrate support holder is capable of tilting to the left and right around an axis parallel to a surface of the substrate and a surface of the sputtering target, and when tilting to the left and right, an angle between a line segment connecting a center of the sputtering target to a center of the substrate and a normal to the surface of the substrate falls within a range from 10° (inclusive) to 80° (inclusive).

There is provided a sputter deposition chamber according to the present invention, comprising:

a substrate support holder for supporting a substrate on which a thin film is deposited;

a sputtering cathode which is electrically insulated from the substrate, and is arranged to be opposite to the substrate; and a sputtering target which is supported by the sputtering cathode, and is made of a material identical to the thin film or a source material of the thin film, wherein the sputtering cathodes each supporting the sputtering target are provided at two positions within an identical plane almost parallel to a surface of the substrate, and an angle between a line segment connecting a center of the sputtering target to a center of the substrate and a normal to the surface of the substrate falls within a range from 10° (inclusive) to 80° (inclusive), and the sputtering cathodes are switched to be powered on.

Alternatively, there is provided an apparatus for manufacturing a magnetoresistive element according to the present invention, in which a buffer layer, an antiferromagnetic layer, a first magnetization fixed layer, an exchange-coupling nonmagnetic layer, a second magnetization fixed layer, a tunnel barrier layer or nonmagnetic conductive layer, a magnetization free layer, and a protective layer are stacked on a substrate by sputter deposition, the apparatus comprising:

a vacuum conveying chamber having a substrate conveying mechanism;

a first sputter deposition chamber which is connected to the vacuum conveying chamber, and deposits at least one of the first magnetization fixed layer, the second magnetization fixed layer, and the magnetization free layer; and a second sputter deposition chamber which is connected to the vacuum conveying chamber, and deposits, of the buffer layer, the antiferromagnetic layer, the first magnetization fixed layer, the exchange-coupling nonmagnetic layer, the second magnetization fixed layer, the tunnel barrier layer or nonmagnetic conductive layer, the magnetization free layer, and the protective layer, layers other than the layers deposited in the first sputter deposition chamber.

Advantageous Effects of Invention

According to the present invention, it is possible to impart high magnetic anisotropy to the magnetic layer of a magnetoresistive element, to improve the thermal stability, and to decrease the size of the magnetoresistive element. This enables to address an increase in storage capacity of a magnetic disk or magnetic random access memory.

BRIEF DESCRIPTION OF DRAWINGS

The accompanying drawings, which are incorporated in and constitute a part of the specification, illustrate embodiments of the present invention and, together with the description, serve to explain the principles of the present invention.

FIG. 2 is a view showing the film structure of a spin valve tunnel magnetoresistive element as a manufacturing target according to the present invention;

FIG. 3 is a view for explaining a sputtering particle incident direction on a substrate;

FIG. 4 is a view for explaining a sputtering particle incident direction on a substrate;

FIG. 5 is a view for explaining an example of the second sputter deposition chamber;

DESCRIPTION OF EMBODIMENTS

Embodiments of the present invention will be described below in detail. Note that constituent elements described in the embodiments are merely examples. The technical scope of the present invention is determined by the scope of claims and is not limited by the following individual embodiments.

Figure 1:
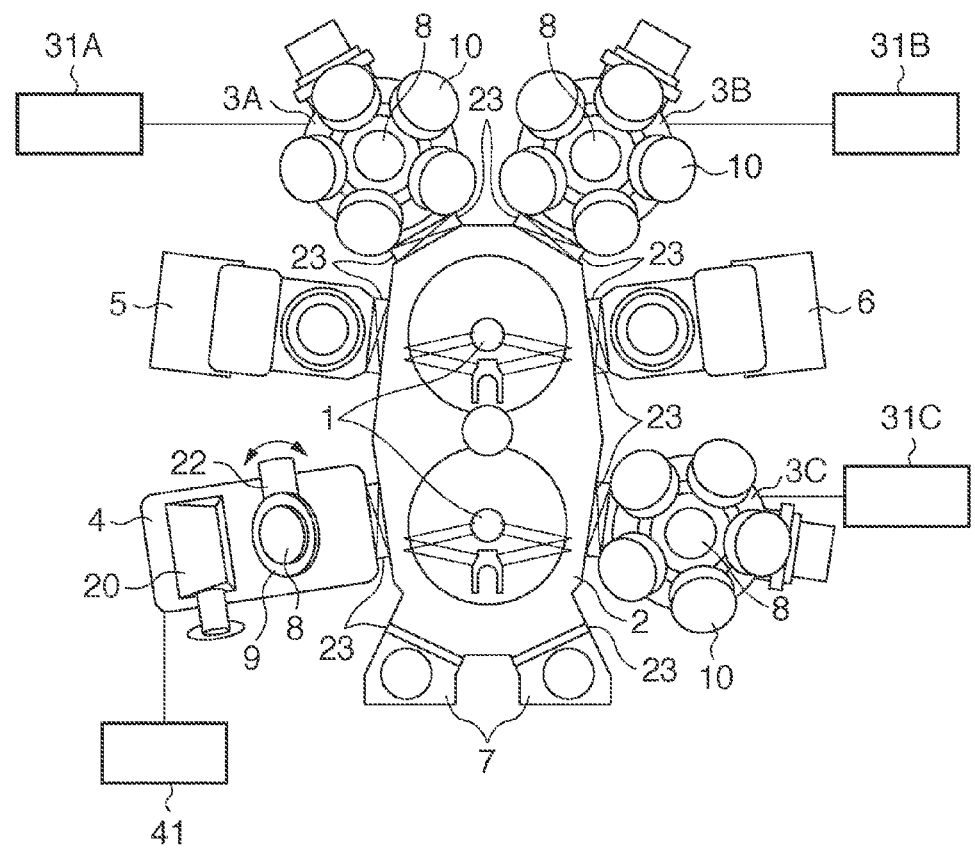
FIG. 1 is a view showing the arrangement of a magnetoresistive element manufacturing apparatus according to the present invention.

FIG. 1 is a view showing the arrangement of a magnetoresistive element manufacturing apparatus (to be simply referred to as "manufacturing apparatus" hereinafter) according to the present invention.

The manufacturing apparatus in this example includes a vacuum conveying chamber 2 having two substrate conveying mechanisms (vacuum conveying robots) 1, three first sputter deposition chambers 3A to 3C, a second sputter deposition chamber 4 according to the present invention, a substrate preprocessing chamber 5, an oxidation processing chamber 6, and two load lock chambers 7. The three first sputter deposition chambers 3A to 3C, the second sputter deposition chamber 4, the substrate preprocessing chamber 5, the oxidation processing chamber 6, and the two load lock chambers 7 are connected to the vacuum conveying chamber 2 via respective gate valves 23.

Each of the first sputter deposition chambers 3A to 3C has five sputtering cathodes 10 having a flat plate shape so that they surround a substrate 8 centrally supported on itself and are electrically insulated from the substrate 8. Each sputtering cathode 10 supports a sputtering target (not shown) made of the same material as a thin film to be deposited or its source material. Each of the first sputter deposition chambers 3A to 3C performs deposition (rotational oblique incidence sputter deposition) by making sputtering particles incident from an oblique direction while rotating the corresponding substrate 8, in which different kinds of sputtering targets are supported by the respective sputtering cathodes 10. This makes it possible to deposit five kinds of thin films by switching the sputtering cathodes 10 to be powered on.

The second sputter deposition chamber 4 has a sputtering cathode 20 with a regular polygonal prism shape, which is electrically insulated from the substrate 8. The sputtering cathode 20 can rotate in the circumferential direction, and supports, on respective side surfaces, sputtering targets 21 (see FIG. 5) made of the same material as a thin film to be deposited or its source material. By rotating the sputtering cathode 20 in the circumferential direction, it is possible to make any of the sputtering targets 21 opposite to the substrate 8 supported by a substrate support holder 9. The substrate support holder 9 can tilt to the left and right around an axis 22 which is parallel to the surface of the substrate 8 and that of the sputtering target 21 supported by the sputtering cathode 20.

The sputtering cathode 20 of the second sputter deposition chamber 4 of this example has, for example, a triangular prism shape, and can support three kinds of sputtering targets 21. Selecting a sputtering target 21 to be opposite to the substrate 8 makes it possible to deposit three kinds of thin films. The sputtering cathode 20 is not limited to having the triangular prism shape but may have a polygonal prism shape with four or more sides. A sputtering cathode 20 having a flat plate shape may be used in the second sputter deposition chamber 4.

All vacuum chambers except for the load lock chambers 7 are respectively pressure-reduced by vacuum pumps to have a vacuum atmosphere of $2 \times 10^{-6}$ Pa or less. The vacuum conveying robots 1 move the substrate 8 between the vacuum chambers in a vacuum. The load lock chambers 7 are used to load the substrate 8 from the atmosphere to the vacuum conveying chamber 2 and to remove the substrate 8 from a vacuum to the atmosphere after forming a thin film on the substrate 8. The substrate preprocessing chamber 5 is used to remove impurities in the atmosphere deposited on the surface of the substrate 8 loaded from the atmosphere. The first sputter deposition chambers 3A to 3C are used to deposit all layers except for a magnetic layer deposited by the second sputter deposition chamber 4. To form the tunnel barrier layer of the tunnel magnetoresistive element, the oxidation processing chamber 6 is used to form a tunnel barrier layer by oxidizing a metal thin film as a precursor of the tunnel barrier layer.

Figure 14:
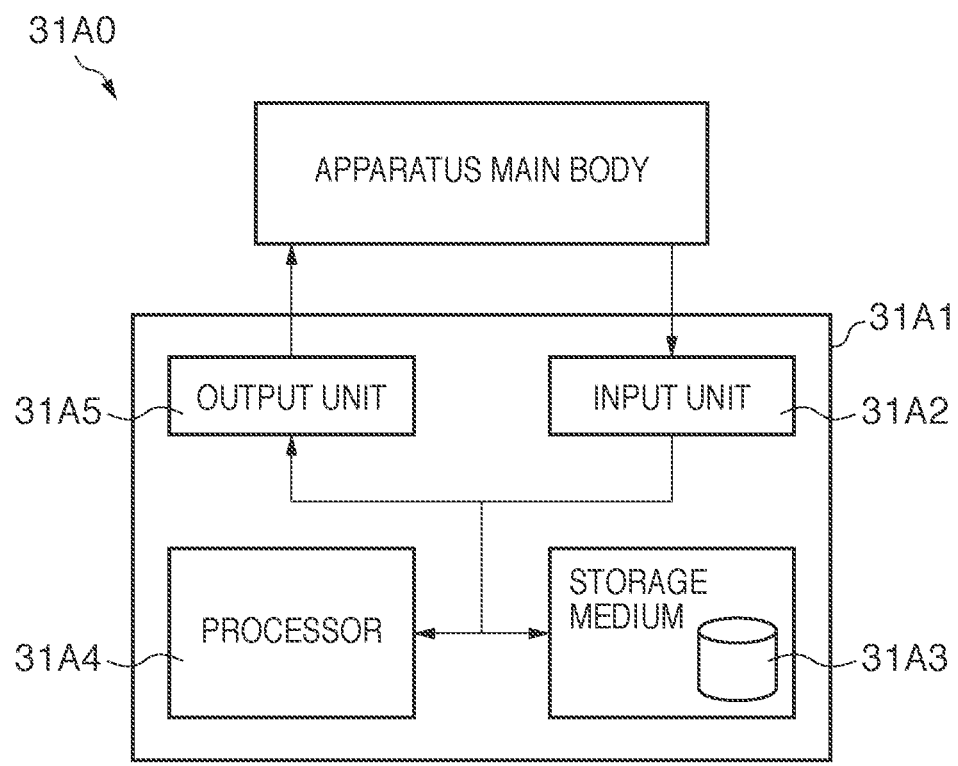
FIG. 14 is a block diagram showing the schematic arrangement of a computer.

The magnetoresistive element manufacturing apparatus shown in FIG. 1 has process controllers 31A, 31B, 31C, and 41 for performing a series of process control operations for the first sputter deposition chambers 3A, 3B, and 3C and the second sputter deposition chamber 4, respectively. The process controllers 31A, 31B, 31C, and 41 can respectively receive an input signal from the manufacturing apparatus main body (the first sputter deposition chambers and the second sputter deposition chamber), and control execution of programs programmed to perform processing in the manufacturing apparatus in accordance with flowcharts, thereby outputting operation instructions obtained from a result of execution to the manufacturing apparatus main body. The arrangement of each of the process controllers 31A, 31B, 31C, and 41 basically has the arrangement of a computer 31A1 shown in FIG. 14, which includes an input unit 31A2, a storage medium 31A3 storing programs and data, a processor 31A4, and an output unit 31A5, thereby controlling the corresponding apparatus main body. The input unit 31A2 allows to externally input instructions in addition to providing a function of inputting data from the apparatus main body.

The process controllers 31A, 31B, 31C, and 41 control the following procedure (process). That is, sputter deposition of at least one of the first magnetization fixed layer, the second magnetization fixed layer, and a magnetization free layer is performed by making sputtering particles obliquely incident on the substrate from a certain incident direction at a certain incident angle and using a stationary non-rotated substrate. Then, sputter deposition of at least one of a buffer layer, an antiferromagnetic layer, an exchange-coupling nonmagnetic layer, a tunnel barrier layer or nonmagnetic conductive layer, a magnetization free layer, and a protective layer is performed by making sputtering particles obliquely incident on the plate at a certain incident angle and using a rotated substrate.

Furthermore, the process controllers 31A, 31B, 31C, and 41 control the following procedure (process). That is, sputter deposition of at least one of the first magnetization fixed layer, the second magnetization fixed layer, and a magnetization free layer is performed by making sputtering particles obliquely incident on the substrate from a certain incident direction at a certain incident angle and using a stationary non-rotated substrate. Then, sputter deposition of at least one of a buffer layer, an antiferromagnetic layer, an exchange-coupling nonmagnetic layer, a tunnel barrier layer or nonmagnetic conductive layer, a magnetization free layer, and a protective layer is performed by making sputtering particles perpendicularly incident on the substrate.

FIG. 2 is a view showing the film structure of a spin valve tunnel magnetoresistive element as a manufacturing target according to the present invention.

In the tunnel magnetoresistive element of this example, a buffer layer 11, an antiferromagnetic layer 12, a first magnetization fixed layer 13, an exchange-coupling nonmagnetic layer 14, a second magnetization fixed layer 15, a tunnel barrier layer 16, a magnetization free layer 17, and a protective layer 18 successively undergo sputter deposition in sequence and are stacked on the substrate. Deposition is done by, for example, DC sputtering.

The magnetic moment of the first magnetization fixed layer 13 is fixed in one direction by the exchange coupling with the antiferromagnetic layer 12. The magnetic moment of the second magnetization fixed layer 15 is fixed in a direction antiparallel to that in the exchange-coupling nonmagnetic layer 14. A magnetization fixed layer 19 having three layers of the first magnetization fixed layer 13, exchange-coupling nonmagnetic layer 14, and second magnetization fixed layer 15 forms a stacked ferrimagnetic fixed layer. The magnetization fixed layer 19 of the present invention is not limited to the stacked ferrimagnetic fixed layer with the three-layered structure, and may have a single-layered structure including one magnetic layer. Furthermore, each of the first magnetization fixed layer 13 and the second magnetization fixed layer 15 may have a stacked structure including two or more magnetic layers.

The buffer layer 11 uses, for example, tantalum (Ta) as its material, whose film thickness is preferably 5 to 50 nm.

The antiferromagnetic layer 12 uses, as its material, platinum manganese (PtMn) whose film thickness is preferably 10 to 30 nm, iridium manganese (IrMn) whose film thickness is preferably 5 to 15 nm, or the like.

Inserting a seed layer (not shown) between the buffer layer 11 and the antiferromagnetic layer 12 improves the crystallizability of the antiferromagnetic layer 12, thereby obtaining the effect of enhancing an exchange coupling magnetic field generated between the antiferromagnetic layer 12 and the first magnetization fixed layer 13. Such seed layer uses nickel-iron (NiFe), nickel-iron-chromium (NiFeCr), nickel-chromium (NiCr), ruthenium (Ru), or the like as its material, whose film thickness is preferably 1 to 10 nm.

It is possible to form the buffer layer 11 and the antiferromagnetic layer 12 by rotational oblique incidence sputter deposition using any of the first sputter deposition chambers 3A to 3C shown in FIG. 1.

The first magnetization fixed layer 13 uses, for example, cobalt-iron (CoFe), whose composition ratio is preferably CoFe=90:10 to 70:30 at %. The film thickness is preferably 1 to 3 nm. As long as the film thickness falls within this range, the first magnetization fixed layer 13 may contain at least CoFe, and have a multilayered film structure with two or more kinds of magnetic layers stacked.

It is preferable to form the first magnetization fixed layer 13 by deposition done by making sputtering particles obliquely incident on the substrate 8 from a certain incident direction at a certain incident angle in the second sputter deposition chamber 4 shown in FIG. 1. In deposition (unidirectional oblique incidence sputter deposition), by keeping an angle θ between a normal to the surface of the substrate 8 and the sputtering particle incident direction (the direction of a line segment connecting the center of the sputtering target and that of the substrate 8) at a certain angle of 10° to 80°, the sputtering particle incident angle is made constant, as shown in FIG. 3. Furthermore, by not making the substrate 8 rotate, the sputtering incident direction on the substrate 8 is fixed in one direction, as shown in FIG. 4. If the angle θ is smaller than 10°, it is difficult to obtain the magnetic anisotropy. If the angle θ is larger than 80°, it is difficult to deposit sputtering particles on the substrate 8.

The exchange-coupling nonmagnetic layer 14 can use ruthenium (Ru), rhodium (Rh), chromium (Cr), iridium (Ir), or the like, or an alloy of the elements. An Ru layer needs to have a film thickness such that antiferromagnetic coupling is formed between the first magnetization fixed layer 13 and the second magnetization fixed layer 15 by RKKY interaction, which is preferably 0.7 to 0.9 nm called the second peak in practical.

It is possible to form the exchange-coupling nonmagnetic layer 14 by rotational oblique incidence sputter deposition using any of the first sputter deposition chambers 3A to 3C shown in FIG. 1.

The second magnetization fixed layer 15 uses cobalt-iron-boron (CoFeB). Preferably, the boron concentration is 10 to 20 at %, and the composition ratio of remaining CoFe is 90:10 to 10:90 at %. A film thickness of 1 to 3 nm is preferably used. If the film thickness falls within this range, the second magnetization fixed layer 15 may contain at least CoFeB, and have a multilayered film structure with two or more kinds of magnetic layers stacked.

It is preferable to form the second magnetization fixed layer 15 by unidirectional oblique incidence sputter deposition using the second sputter deposition chamber 4 shown in FIG. 1, like the first magnetization fixed layer 13.

The tunnel barrier layer 16 of the tunnel magnetoresistive element manufactured according to the present invention uses magnesium oxide (MgO), aluminum oxide ($Al_2O_3$), titanium oxide ($TiO_2$), or the like. MgO preferably has a single-crystal structure in which (100) crystal faces are oriented parallel to a film surface, or a poly-crystalline structure including such crystal components.

It is possible to form the tunnel barrier layer 16 by directly depositing an oxide film by RF magnetron sputtering using an oxide target. The deposition process can be done by rotational oblique incidence sputter deposition using any of the first sputter deposition chambers 3A to 3C shown in FIG. 1. The tunnel barrier layer 16 may be formed by depositing a metal film as its precursor by DC magnetron sputtering using any of the first sputter deposition chambers 3A to 3C while rotating the substrate 8, and then oxidizing the metal film within the oxidation processing chamber 6. For the tunnel barrier layer 16, the resultant oxide film preferably has a film thickness of 0.5 to 2.5 nm.

A giant magnetoresistive element as a manufacturing target of the present invention has a structure in which the tunnel barrier layer 16 is replaced by a nonmagnetic conductive layer. The nonmagnetic conductive layer uses copper (Cu) as its material, and may be a mixed layer of Cu and an oxide in which Cu mainly has electrical conductivity. It is also possible to form the nonmagnetic conductive layer by rotational oblique incidence sputter deposition using any of the first sputter deposition chambers 3A to 3C shown in FIG. 1.

As the magnetization free layer 17, a single-layered structure including cobalt-iron-boron (CoFeB), a two-layered structure including CoFeB and nickel-iron (NiFe) or cobalt-iron (CoFe) and NiFe, a three-layered structure including CoFeB, Ru, and CoFeB, or CoFeB, Ru, and NiFe, or CoFe, Ru, and NiFe, or a four-layered structure including CoFeB, CoFe, Ru, and CoFe, or CoFeB, CoFe, Ru, and NiFe is applicable.

It is preferable to form the magnetization free layer 17 by unidirectional oblique incidence sputter deposition using the second sputter deposition chamber 4 shown in FIG. 1, like the first magnetization fixed layer 13. If the magnetization free layer 17 has a multilayered structure, it is preferable to form at least one magnetic layer by unidirectional oblique incidence sputter deposition within the second sputter deposition chamber 4. The magnetization free layer 17 used in the present invention preferably has a film thickness of 1.5 to 10 nm.

In the present invention, at least one of the first magnetization fixed layer 13, second magnetization fixed layer 15, and magnetization free layer 17, most preferably all of them are formed by unidirectional oblique incidence sputter deposition, in which sputtering particles are made incident on the substrate 8 from a certain incident direction at a certain incident angle, using the second sputter deposition chamber 4. That is, in the second sputter deposition chamber 4, by keeping the angle $\theta$ between the normal to the surface of the substrate 8 and the sputtering particle incident direction at a certain angle within the range of 10° (inclusive) to 80° (inclusive), the sputtering particle incident angle is made constant, as shown in FIG. 3. Furthermore, by not making the substrate 8 rotate, the sputtering particle incident direction on the substrate 8 is fixed in one direction, as shown in FIG. 4.

When performing sputter deposition of at least one of the first magnetization fixed layer 13, second magnetization fixed layer 15, and magnetization free layer 17, most preferably all of them in the second sputter deposition chamber 4, it is easier to obtain a uniform film thickness by performing deposition from two directions. That is, deposition done by making deposition sputtering particles obliquely incident on the substrate 8 from a certain incident direction at a certain incident angle is temporarily suspended, the substrate 8 is rotated about its central axis by 180°, and then deposition process is resumed. This can be done by providing a rotation mechanism which suspends the deposition process in progress, and rotates the substrate support holder 9 about the central axis of the substrate 8 by 180°. Such deposition in which one layer is formed by making sputtering particles obliquely incident from two certain directions at the same incident angle is called bidirectional oblique incidence sputter deposition.

Bidirectional oblique incidence sputter deposition in the second sputter deposition chamber 4 may be done by not rotating the substrate 8 about its central axis by 180° but tilting the substrate support holder 9 to the left and right around the one axis 22 parallel to both the surface of the substrate 8 and that of the sputtering target 21, as shown in 5a and 5b of FIG. 5. More specifically, the substrate support holder 9 can tilt to the left and right around the axis 22, and by tilting the substrate support holder 9 such that angles $\theta a$ and $\theta b$ between the normal to the surface of the substrate 8 and a line segment connecting the center of the sputtering target 21 to that of the substrate 8 are the same angle ($\theta a=\theta b$) within the range of 10° (inclusive) to 80° (inclusive), it is possible to perform uniform deposition from two directions.

Figure 6:
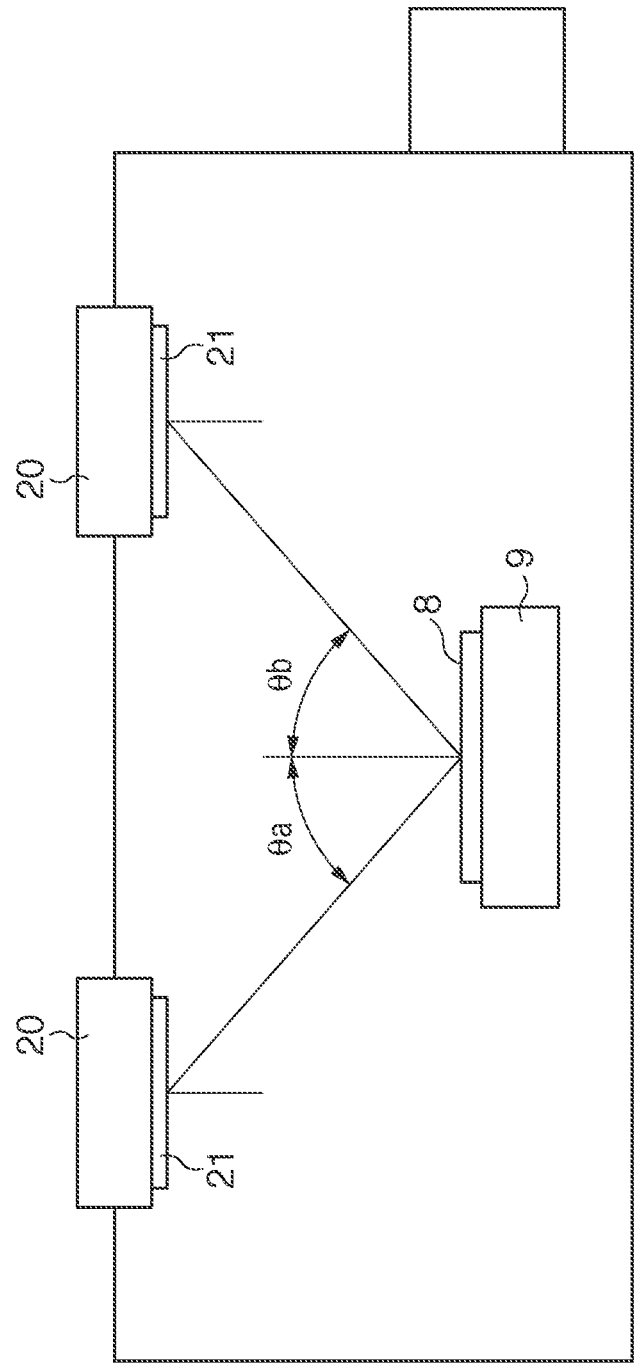
FIG. 6 is a view for explaining another example of the second sputter deposition chamber.

It is also possible to perform unidirectional oblique incidence sputter deposition in the second sputter deposition chamber 4 by providing sputtering cathodes 20 in advance at two positions and switching them to be powered on during deposition, as shown in FIG. 6. In the example shown in FIG. 6, the sputtering cathodes 20 with a flat plate shape each supporting a sputtering target 21 are provided at two positions within the same surface almost parallel to the surface of the substrate 8. While the angles $\theta a$ and $\theta b$ between the normal to the surface of the substrate 8 and line segments connecting the centers of the sputtering targets 21 supported by the sputtering cathodes 20 to that of the substrate 8 are the same angle ($\theta a=\theta b$) within the range of 10° (inclusive) to 80° (inclusive), it is possible to switch the sputtering cathodes 20 to be powered on. With such arrangement, deposition is partly done by powering on one of the sputtering cathodes 20, and then the remaining deposition process is done by powering on the other sputtering cathode 20, thereby achieving uniform deposition from the two directions.

To enhance resultant magnetic anisotropy, it is preferable to perform a magnetic field annealing process after sputter deposition in the second sputter deposition chamber 4 or completion of deposition of all layers. In the magnetic field annealing process, an annealing process is executed for 0.5 to 10 hrs at a temperature of 230 to 400° C. while applying a magnetic field of 1 T (tesla) or more in a vacuum, argon, or nitrogen atmosphere.

Figure 7:
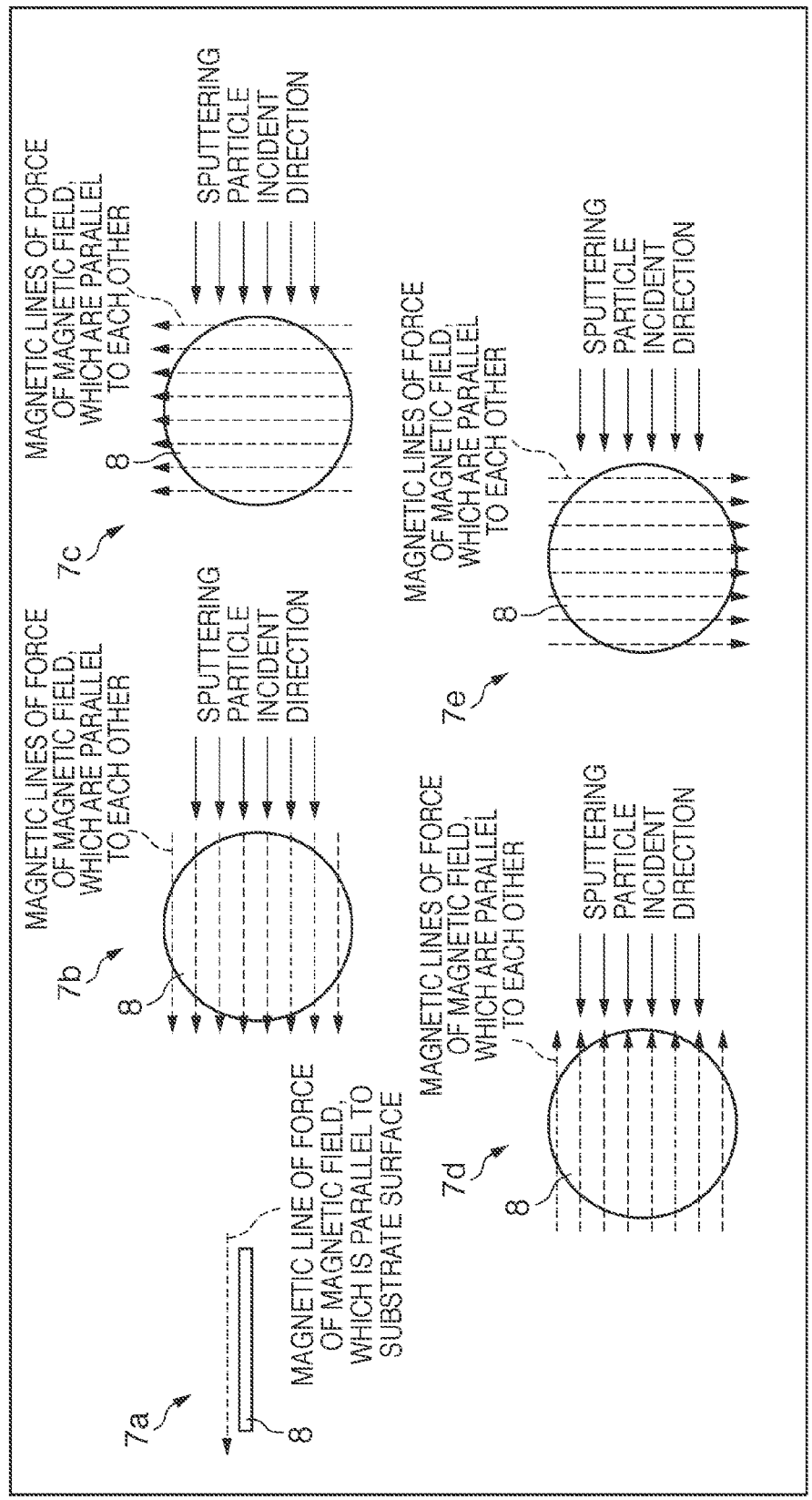
FIG. 7 is a view for explaining a magnetic field to be applied in deposition in the second sputter deposition chamber or in a magnetic field annealing process.

Preferably, a magnetic field to be applied is parallel to the surface of the substrate 8 as shown in 7a of FIG. 7, in which magnetic lines of force are parallel to each other within the surface of the substrate 8 and whose application direction is as shown in each of 7b to 7e of FIG. 7. The direction shown in 7b of FIG. 7 is the same (a 0° direction) as the sputtering particle incident direction on the substrate 8 in deposition. The direction shown in 7c of FIG. 7 is a direction (90° rotated direction or right-angle direction) shifted by 90° from the sputtering particle incident direction on the substrate 8 in deposition. The direction shown in 7d of FIG. 7 is a direction (180° rotated direction) shifted by 180° from the sputtering particle incident direction on the substrate 8 in deposition. The direction shown in 7e of FIG. 7 is a direction (270° rotated direction) shifted by 270° from the sputtering particle incident direction on the substrate 8 in deposition. It is possible to enhance the magnetic anisotropy by providing the second sputter deposition chamber 4 with a magnetism generation apparatus which can form a magnetic field like that described above in deposition, and performing deposition while applying a magnetic field like that described above.

The protective layer 18 aims to prevent the magnetoresistive characteristics from deteriorating due to oxidation of the manufactured magnetoresistive element in the atmosphere. Since the protective layer 18 is provided immediately on the magnetization free layer 17, a material which is difficult to mix with the magnetization free layer 17 in high-temperature annealing is preferable, and a thick Ta film with a thickness of 5 to 50 nm is generally used. Ta is, however, a material which relatively readily oxidizes. Therefore, the protective layer 18 may have a stacked structure in which a layer contacting with the magnetization free layer 17 may use Ta and a layer exposed to the atmosphere may use a noble metal material difficult to be oxidized such as Ru.

Example 1

Figure 8:
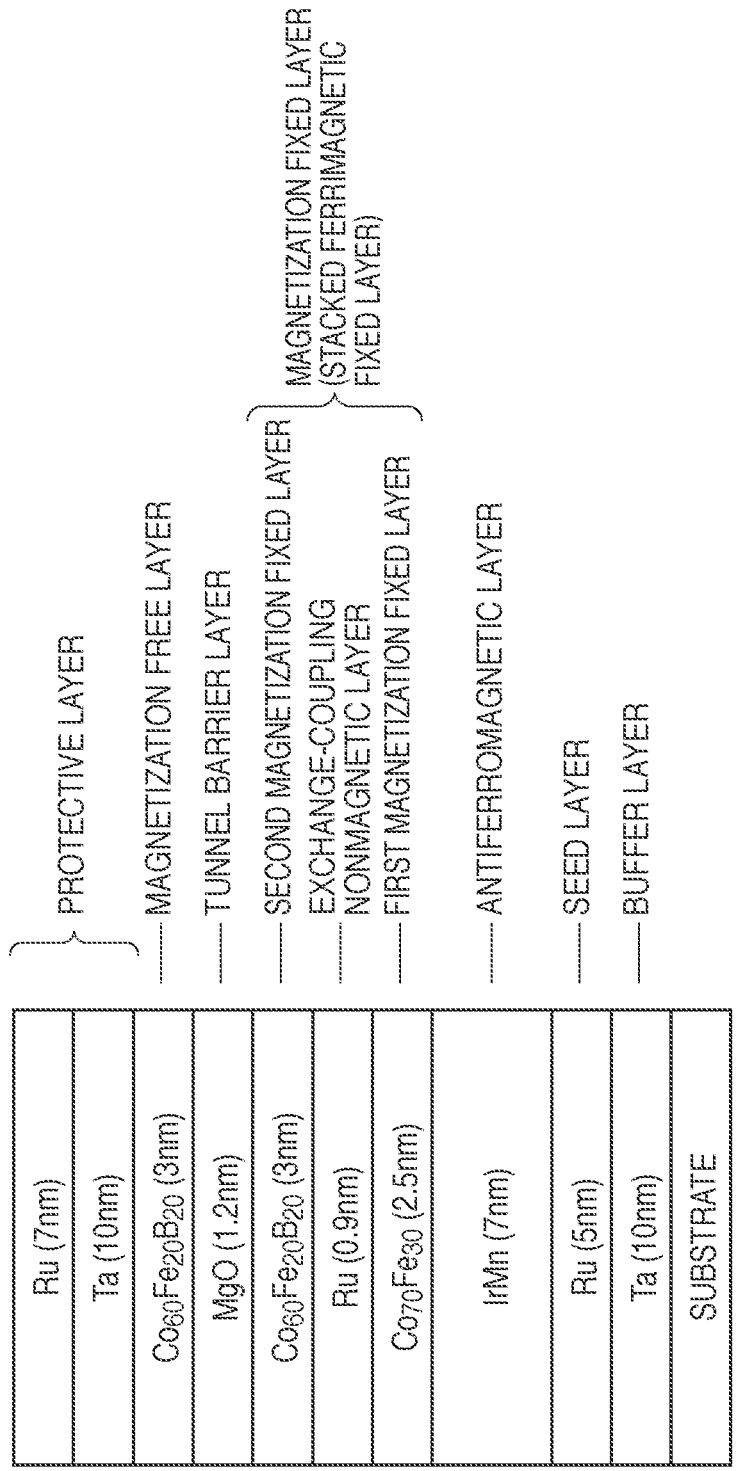
FIG. 8 is a view showing the film structure of a tunnel magnetoresistive element manufactured in Example 1.

FIG. 8 is a view showing the film structure of a tunnel magnetoresistive element manufactured using the manufacturing method and manufacturing apparatus of the present invention.

An IrMn layer with a thickness of 7 nm was used as an antiferromagnetic layer. An Ru layer with a thickness of 5 nm was used as a seed layer. A Ta layer with a thickness of 10 nm was used as a buffer layer. In the tunnel magnetoresistive element, only $CO_{70}Fe_{30}$ of the first magnetization fixed layer underwent unidirectional oblique incidence sputter deposition in the second sputter deposition chamber, and other layers were deposited in the first sputter deposition chamber.

The tunnel magnetoresistive element was placed in a magnetic field annealing furnace after deposition, and then underwent a magnetic field annealing process for 1.5 hrs at 230° C. while applying a magnetic field of 1 T in a vacuum. The magnetic field application direction was parallel to the surface of the substrate (7a of FIG. 7), and was the 0° direction (7b of FIG. 7) or the 90° rotated direction (7c of FIG. 7).

Figure 9:
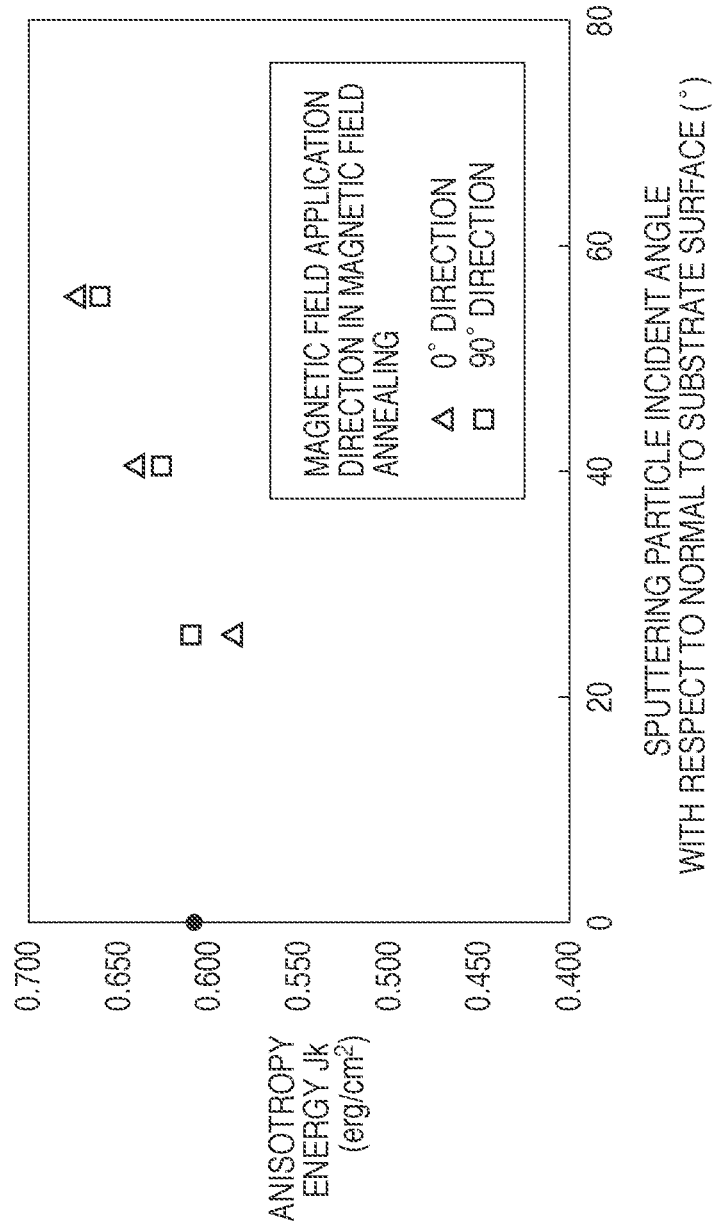
FIG. 9 is a graph showing the relationship between a unidirectional magnetic anisotropy energy $J_k$ and a sputtering particle incident direction with respect to a normal to a substrate surface.

FIG. 9 shows the dependence on an incident angle with respect to a normal to the surface of the substrate when calculating a unidirectional magnetic anisotropy energy $J_k$ using an equation $J_k = Ms \cdot d \cdot H_{ex}$ where $H_{ex}$ is the exchange coupling magnetic field between the antiferromagnetic layer and first magnetization fixed layer of the tunnel magnetoresistive element, Ms is the saturation magnetization of the first magnetization fixed layer, and d is the film thickness of the first magnetization fixed layer. $H_{ex}$ and Ms were calculated from a magnetization curve obtained using a vibrating sample magnetometer (VSM). The measurement principle of the VSM is described in, for example, "Experimental Physics Lecture 6 Magnetic Measurement I" edited by Keiichiro Kon and Hiroshi Yasuoka published by Maruzen Tokyo on Feb. 15, 2000.

According to FIG. 9, it is found that if sputtering particles are incident from one direction and the incident direction tilts 30° or larger from the normal to the surface of the substrate, $J_k$ increases when the magnetic field application direction in magnetic field annealing is 0° or 90°.

Example 2

Figure 10:
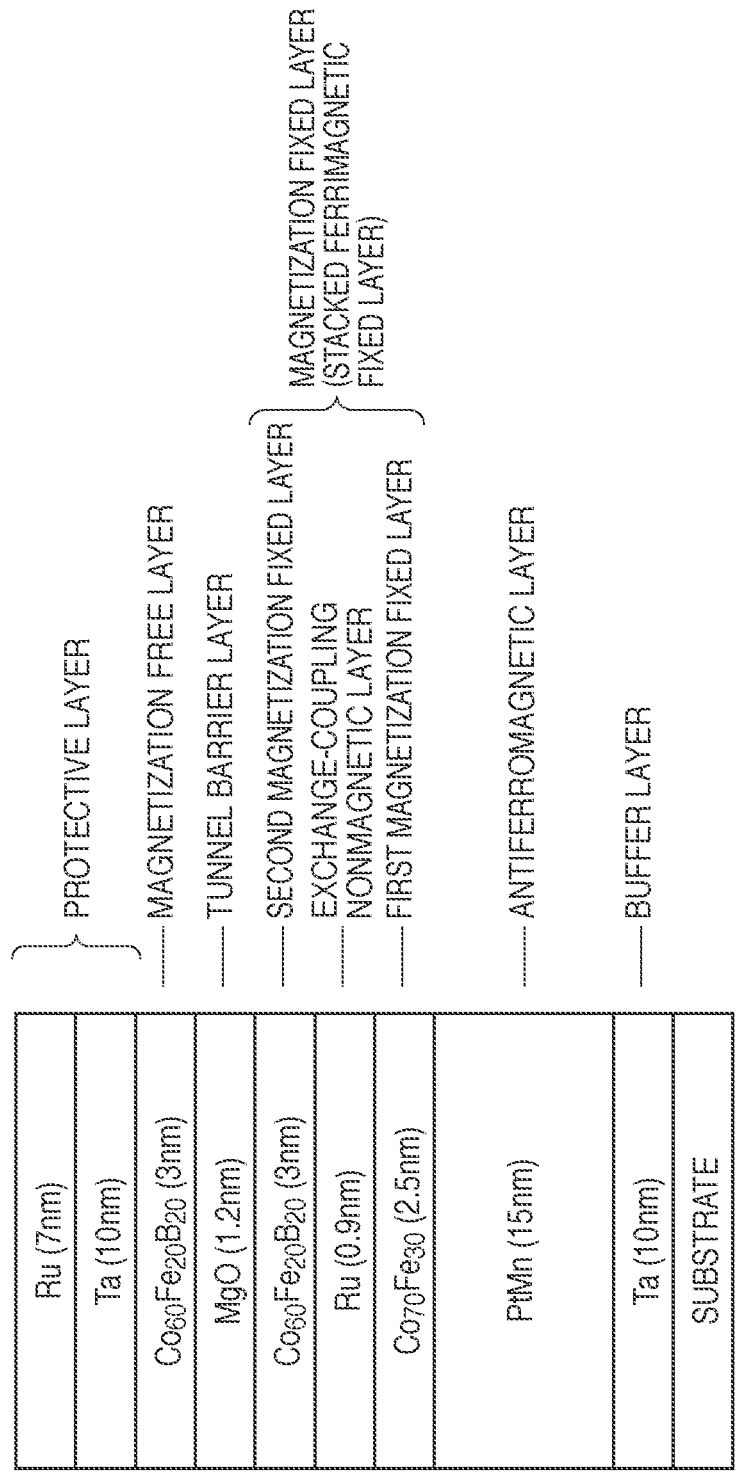
FIG. 10 is a view showing the film structure of a tunnel magnetoresistive element manufactured in Example 2.

FIG. 10 is a view showing the film structure of a tunnel magnetoresistive element manufactured using the manufacturing method and manufacturing apparatus of the present invention.

A PtMn layer with a thickness of 15 nm was used as an antiferromagnetic layer and a Ta layer with a thickness of 10 nm was used as a buffer layer. In the tunnel magnetoresistive element, only $CO_{70}Fe_{30}$ of the first magnetization fixed layer underwent unidirectional oblique incidence sputter deposition in the second sputter deposition chamber, and the angle θ shown in FIG. 3 was 0° or 55°. Other layers were deposited in the first sputter deposition chamber.

The tunnel magnetoresistive element was placed in a magnetic field annealing furnace after deposition, and then underwent a magnetic field annealing process for 2 hrs at 360° C. while applying a magnetic field of 1 T in a vacuum. The magnetic field application direction was parallel to the surface of the substrate (7a of FIG. 7), and was the 90° rotated direction (7c of FIG. 7).

Figure 11:
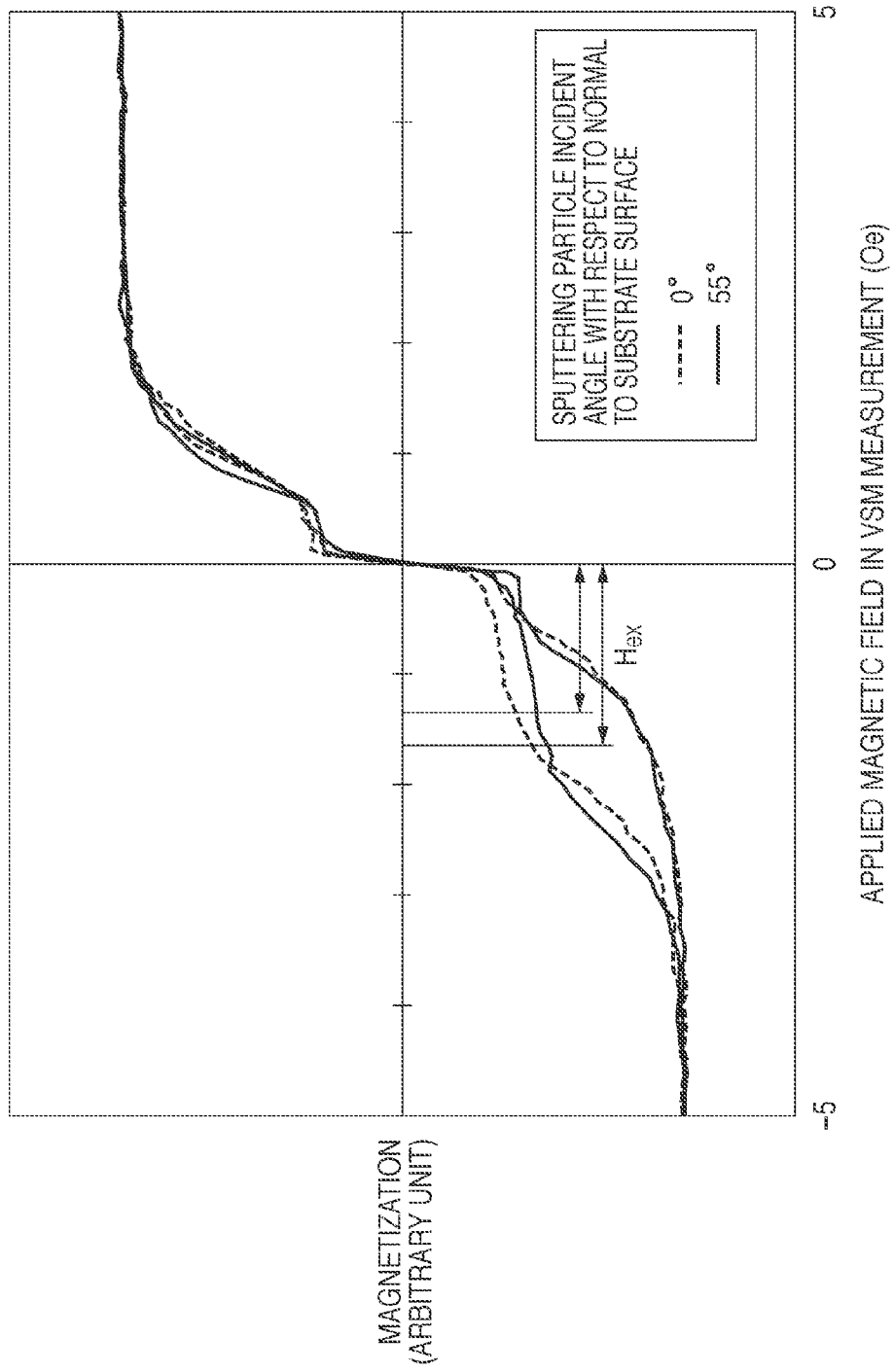
FIG. 11 is a graph showing a result of measuring the magnetization curve of the tunnel magnetoresistive element using a VSM in Example 2.

FIG. 11 shows a result of measuring the magnetization curve of the tunnel magnetoresistive element using a VSM. Each magnetic hysteresis loop represents a shape of three steps. A wide loop in the third quadrant of FIG. 11 corresponds to the hysteresis loop of the first magnetization fixed layer; a very narrow loop near the origin, the hysteresis loop of the magnetization free layer; and a loop in the first quadrant, the hysteresis loop of the second magnetization fixed layer. A distance from a 0 magnetic field at the central point of the hysteresis of the first magnetization fixed layer represents an exchange coupling magnetic field $H_{ex}$. FIG. 11 shows that $H_{ex}$ in a case of an incident angle of 55° is larger than that in a case of an incident angle of 0°, and that the effect of imparting the magnetic anisotropy by unidirectional oblique incidence sputter deposition can be obtained even in a case of the PtMn antiferromagnetic layer.

Example 3

To manufacture a magnetic tunnel element in Examples 1 and 2, deposition of the first magnetization fixed layer was done by bidirectional oblique incidence sputter deposition in which deposition in progress is suspended, and the sputtering particle incident angle is flipped by tilting the substrate support holder around the axis, as shown in FIG. 5. In this case, the same effect was obtained.

Example 4

In the magnetic tunnel element of Examples 1, 2, and 3, it was possible to enhance the antiferromagnetic coupling magnetic field between the first magnetization fixed layer and the second magnetization fixed layer via the exchange coupling nonmagnetic layer by making the second magnetization fixed layer undergo unidirectional or bidirectional oblique incidence sputter deposition in addition to the first magnetization fixed layer.

Example 5

Figure 12:
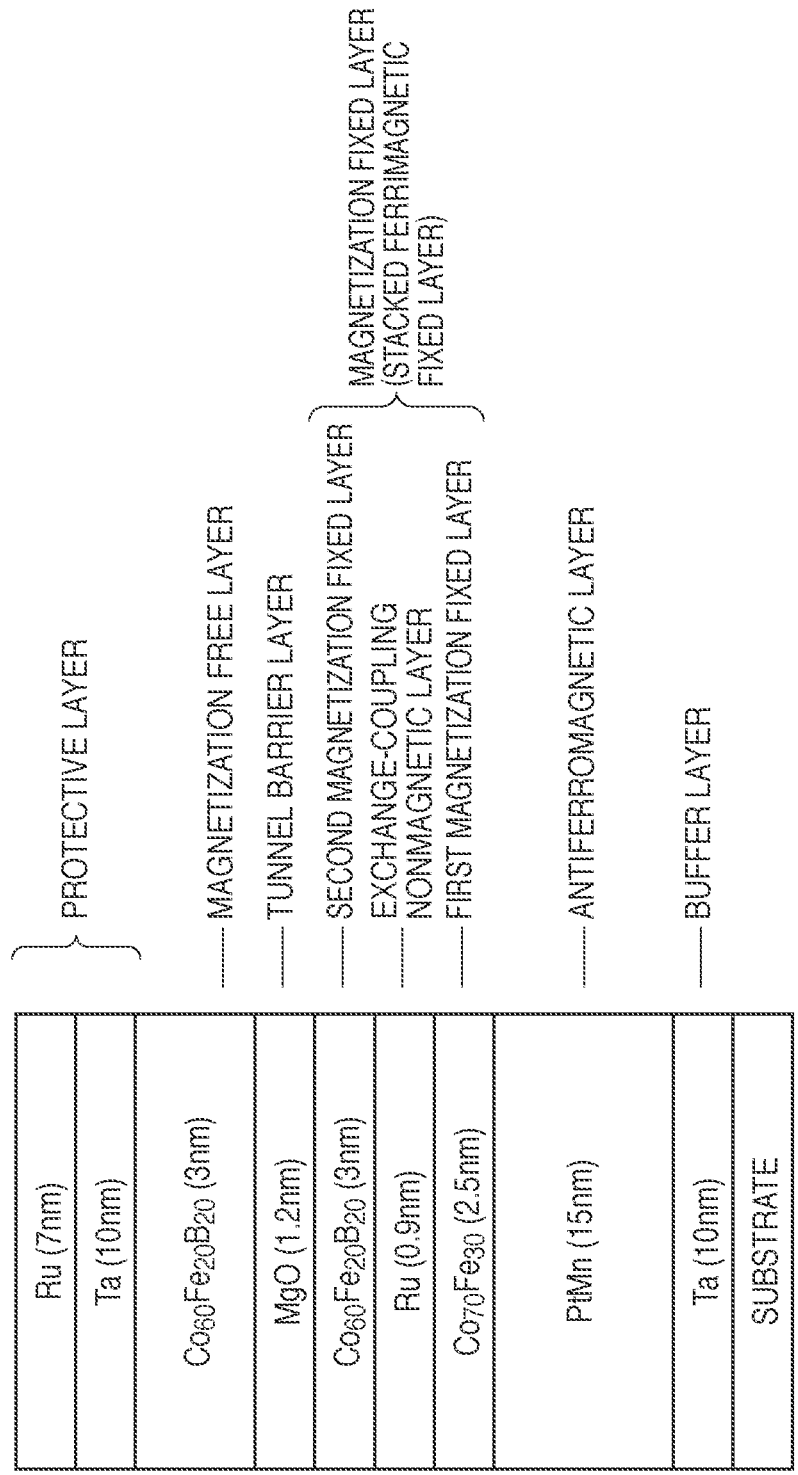
FIG. 12 is a view showing the film structure of a tunnel magnetoresistive element manufactured in Example 4.

FIG. 12 is a view showing the film structure of a tunnel magnetoresistive element manufactured using the manufacturing method and manufacturing apparatus of the present invention.

A PtMn layer with a thickness of 15 nm was used as an antiferromagnetic layer and a Ta layer with a thickness of 10 nm was used as a buffer layer. In the tunnel magnetoresistive element, only a magnetization free layer underwent unidirectional oblique incidence sputter deposition in the second sputter deposition chamber, and other layers were deposited in the first sputter deposition chamber. The magnetization free layer used two kinds of magnetic materials, $CO_{70}Fe_{30}$ and $CO_{60}Fe_{20}B_{20}$. The angle θ described with reference to FIG. 3 was 25°, 40°, or 55°.

For the magnetization free layer, in unidirectional oblique incidence sputter deposition, a magnetic field was applied to the substrate and the induced magnetic anisotropy was imparted. The magnetic field application direction was parallel to the surface of the substrate (7a of FIG. 7), and was the 0° direction (7b of FIG. 7) or the 90° rotated direction (7c of FIG. 7) for $CO_{70}Fe_{30}$. The direction was the 90° rotated direction (7c of FIG. 7) alone for $CO_{60}Fe_{20}B_{20}$.

The tunnel magnetoresistive element was placed in a magnetic field annealing furnace after deposition, and then underwent a magnetic field annealing process for 2 hrs at 360° C. while applying a magnetic field of 1 T in a vacuum. This magnetic field application direction was the same as that in deposition.

An anisotropy magnetic field Hk was examined from a magnetization curve obtained by VSM measurement as the index of the magnetic anisotropy of the magnetization free layer. The anisotropy magnetic field in the magnetization curve is defined in, for example, Akira Kinbara and Hideo Fujiwara, "Thin Film, Applied Physics Series, vol. 3", p. 302, 9th ed. published by Shokabo on Dec. 20, 1989.

For each sample, the magnetic field application direction in VSM measurement was obtained by performing measurement in the parallel (defined as "easy") and perpendicular (defined as "hard") directions for the magnetic field application direction in deposition and magnetic field annealing, and examining the magnitude of the magnetic anisotropy imparted to the corresponding sample from the difference between the magnitudes of Hks in the easy and hard directions. As the difference between the magnitudes of Hks in the easy and hard directions is larger, stronger magnetic anisotropy is imparted. As the difference is smaller, a magnetic film whose magnetic anisotropy is weaker and which has magnetic isotropy is obtained.

Figure 13:
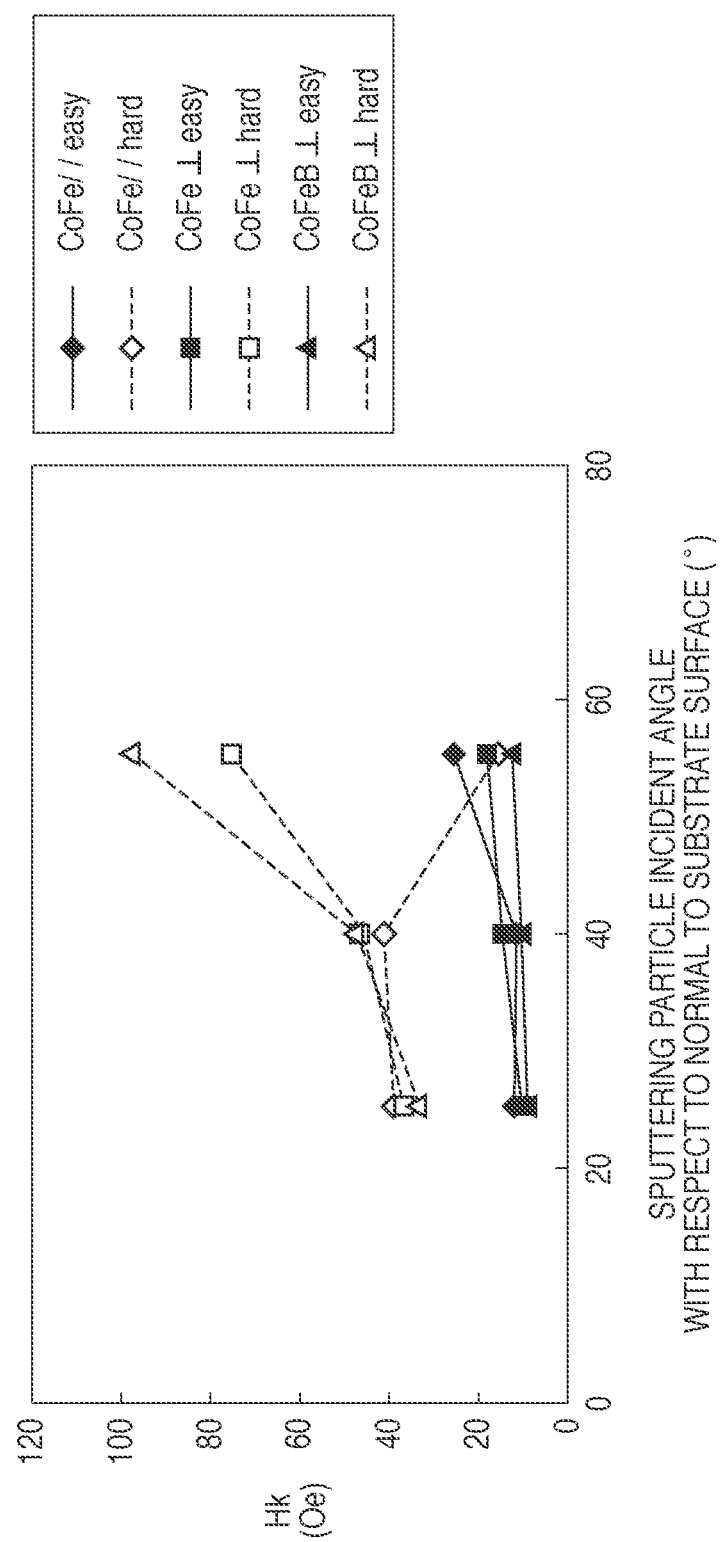
FIG. 13 is a graph showing the relationship between an anisotropy magnetic field Hk and a sputtering particle incident direction with respect to a normal to a substrate surface.

FIG. 13 is a graph in which the y axis represents Hk calculated from the magnetization curve after annealing a magnetic tunnel element and the x axis represents the sputtering particle incident angle. In FIG. 13, "//" represents a case in which the magnetic field application direction in deposition and magnetic field annealing is the 0° direction (7b of FIG. 7), and "⊥" represents a case in which the magnetic field application direction is the 90° rotated direction (7c of FIG. 7). For example, "CoFe//easy" in the example shown in FIG. 13 indicates that the material of the magnetization free layer of the magnetic tunnel element is $CO_{70}Fe_{30}$, that the magnetic field application direction in deposition and magnetic field annealing is the 0° direction, and that the applied magnetic field direction in VSM measurement is parallel to the magnetic field application direction in deposition and magnetic annealing.

When the magnetization free layer is made of CoFe and the magnetic field application direction in deposition and magnetic field annealing is the 0° direction, Hk in the hard direction is much larger than that in the easy direction except for a case in which the sputtering particle incident angle θ with respect to the normal to the substrate surface is 55°. This means that the magnetization free layer has the magnetic anisotropy, and its direction is parallel to the magnetic field application direction in deposition and magnetic field annealing. The strength of the magnetic anisotropy increases as the sputtering particle incident angle with respect to the normal to the substrate surface is larger. It is found from the foregoing that the magnetic anisotropy of the magnetization free layer basically depends on the magnetic field application direction in deposition and magnetic field annealing, and the effect of imparting the magnetic anisotropy is enhanced by increasing the sputtering particle incident angle with respect to the normal to the substrate surface.

It is also clear that although the strength of the magnetic anisotropy hardly varies depending on the material used for the magnetization free layer, the sputtering particle incident direction, or the magnetic field application direction in deposition and magnetic field annealing until the incident angle with respect to the normal to the substrate surface is 40°, if the sputtering particle incident angle with respect to the normal to the substrate surface is larger than 40°, the magnetic field application direction in deposition and magnetic field annealing is preferably the 90° rotated direction (7c of FIG. 7) with respect to the sputtering particle incident direction, and CoFeB is imparted with larger magnetic anisotropy than CoFe. The same effect is obtained in a case of the 270° rotated direction (7e of FIG. 7).

Example 6

In the magnetic tunnel element in Example 5, the same effect was obtained by performing bidirectional oblique incidence sputter deposition in which deposition in progress was temporarily suspended, the substrate support holder was tilted around the axis of the substrate support holder, and the sputtering particle incident direction was flipped, as shown in FIG. 5, to deposit a CoFe magnetization free layer.

Example 7

In Example 1, 2, 3, or 4, it was possible to manufacture a tunnel magnetoresistive element in which the thermal stabilities of a magnetization fixed layer and magnetization free layer were improved by performing unidirectional or bidirectional oblique incidence sputter deposition to deposit the magnetization free layer and to impart magnetic anisotropy to the magnetization free layer, as in Example 5 or 6.

Example 8

In a giant magnetoresistive element obtained by replacing a MgO tunnel barrier layer with a nonmagnetic conductive layer containing Cu in the tunnel magnetoresistive element used in Examples 1 to 7, the same effect was obtained.

OTHER EMBODIMENTS

The object of the present invention is also achieved when a computer-readable storage medium which records software programs for implementing the functions of the above-described embodiment is supplied to a system or apparatus. It is also achieved when the computer (or the CPU or MPU) of the system or apparatus reads out and executes the programs stored in the storage medium.

In this case, the programs read out from the storage medium implement the functions of the above-described embodiment, and the storage medium which stores the programs constitutes the present invention.

The storage medium for supplying the programs includes a flexible disk, hard disk, optical disk, magnetooptical disk, CD-ROM, CD-R, nonvolatile memory card, and ROM.

The functions of the above-described embodiment are implemented when the computer executes the readout programs. Also, the above-described embodiment is implemented when an OS (Operating System) or the like running on the computer performs some or all of actual processes on the basis of the instructions of the programs.

The preferred embodiments of the present invention have been described with reference to the accompanying drawings. The present invention is not limited to those embodiments, and various modifications may be made within the technical scope defined by claims.

This application claims the benefit of Japanese Patent Application No. 2008-162385, filed Jun. 20, 2008, which is hereby incorporated by reference herein in its entirety.

The invention claimed is:

1. A method of manufacturing a spin valve tunnel magnetoresistive element in which an antiferromagnetic layer, a first magnetization fixed layer, an exchange-coupling nonmagnetic layer, a second magnetization fixed layer, a tunnel barrier layer, and a magnetization free layer are stacked in sequence on a substrate, the method comprising:

a first step of performing sputter deposition of the antiferromagnetic layer by using a sputtering target which makes sputtering particles obliquely incident on the substrate while rotating the substrate around a rotation axis; and a second step of performing sputter deposition of the first magnetization fixed layer on the antiferromagnetic layer by using sputtering targets being provided such that angles θa and θb between a normal to a surface of the substrate and a line segment connecting a center of each of the sputtering targets supported by each of sputtering cathodes provided at two positions to a center of the substrate are the same angle (θa=θb within a range of 10° (inclusive) to 80° (inclusive), while switching the sputtering cathodes to be powered on during the sputter deposition and keeping a state where the substrate is not rotated around the rotation axis; and a third step of performing sputter deposition of the second magnetization fixed layer on the exchange-coupling nonmagnetic layer by using sputtering targets being provided such that angles θa and θb between a normal to a surface of the substrate and a line segment connecting a center of each of the sputtering targets supported by each of sputtering cathodes provided at two positions to a center of the substrate are the same angle (θa=θb) within a range of 10° (inclusive) to 80° (inclusive), while switching the sputtering cathodes to be powered on during the sputter deposition and keeping a state where the substrate is not rotated around the rotation axis.

2. A method of manufacturing a spin valve tunnel magnetoresistive element in which an antiferromagnetic layer, a first magnetization fixed layer, an exchange-coupling nonmagnetic layer, a second magnetization fixed layer, a tunnel barrier layer, and a magnetization free layer are stacked in sequence on a substrate, the method comprising:

a first step of performing sputter deposition of the antiferromagnetic layer by using a sputtering target which makes sputtering particles obliquely incident on the substrate while rotating the substrate around a rotation axis;

a second step of performing sputter deposition of the first magnetization fixed layer on the antiferromagnetic layer by using a sputtering target being provided such that angles θa and θb between a normal to a surface of the substrate and a line segment connecting a center of the sputtering target to a center of the substrate are the same angle (θa=θb) within a range of 10° (inclusive) to 80° (inclusive) in a case where the substrate is tilted to left and right around an axis parallel to a surface of the sputtering target, while tilting the substrate to the left and right around the axis during the sputter deposition and keeping a state where the substrate is not rotated around the rotation axis; and a third step of performing sputter deposition of the second magnetization fixed layer on the exchange-coupling nonmagnetic layer by using a sputtering target being provided such that angles θa and θb between a normal to a surface of the substrate and a line segment connecting a center of the sputtering target to a center of the substrate are the same angle (θa=θb) within a range of 10° (inclusive) to 80° (inclusive) in a case where the substrate is tilted to left and right around an axis parallel to a surface of the sputtering target, while tilting the substrate to the left and right around the axis during the sputter deposition and keeping a state where the substrate is not rotated around the rotation axis.

3. The method according to claim 1, further comprising a step of performing sputter deposition a buffer layer on the substrate by using a sputtering target which makes puttering particles obliquely incident on the substrate while rotating the substrate around the rotation axis, and wherein the first step performs the sputter deposition of the antiferromagnetic layer on the buffer layer.

4. The method according to claim 1, further comprising a step of performing sputter deposition of the exchange-coupling nonmagnetic layer by using a sputtering target which makes puttering particles obliquely incident on the substrate while rotating the substrate around the rotation axis, and wherein the third step performs the sputter deposition of the second magnetization fixed layer on the exchange-coupling nonmagnetic layer.

5. The method according to claim 2, further comprising a step of performing sputter deposition a buffer layer on the substrate by using a sputtering target which makes puttering particles obliquely incident on the substrate while rotating the substrate around the rotation axis, and wherein the first step performs the sputter deposition of the antiferromagnetic layer on the buffer layer.

6. The method according to claim 2, further comprising a step of performing sputter deposition of the exchange-coupling nonmagnetic layer by using a sputtering target which makes puttering particles obliquely incident on the substrate while rotating the substrate around the rotation axis, and wherein the third step performs the sputter deposition of the second magnetization fixed layer on the exchange-coupling nonmagnetic layer.

* * * * *